US010957829B2

(12) United States Patent
Thombre

(10) Patent No.: US 10,957,829 B2
(45) Date of Patent: Mar. 23, 2021

(54) LIGHT ASSEMBLY HAVING COLLIMATING TIR LENS

(71) Applicant: North American Lighting, Inc., Paris, IL (US)

(72) Inventor: Ashwin Thombre, Farmington Hills, MI (US)

(73) Assignee: NORTH AMERICAN LIGHTING, INC., Paris, IL (US)

( * ) Notice: Subject to any disclaimer, the term of this patent is extended or adjusted under 35 U.S.C. 154(b) by 0 days.

(21) Appl. No.: 16/416,257

(22) Filed: May 19, 2019

(65) Prior Publication Data

US 2020/0365780 A1  Nov. 19, 2020

(51) Int. Cl.
| F21V 5/04 | (2006.01) |
| H01L 33/58 | (2010.01) |
| G02B 27/09 | (2006.01) |
| G02B 27/30 | (2006.01) |

(52) U.S. Cl.
CPC .......... *H01L 33/58* (2013.01); *G02B 27/0955* (2013.01); *G02B 27/30* (2013.01)

(58) Field of Classification Search
CPC . F21V 7/0091; F21V 7/09; F21V 5/04; F21V 5/045; F21V 13/04; F21K 9/69; G02B 2003/0093; G02B 3/08
See application file for complete search history.

(56) References Cited

U.S. PATENT DOCUMENTS

| 2,215,900 A | * | 9/1940 | Bitner | F21V 5/04 |
| | | | | 362/309 |
| 2,254,961 A | * | 9/1941 | Harris | F21V 7/0091 |
| | | | | 362/327 |
| 2,356,654 A | * | 8/1944 | Cullman | F21V 13/04 |
| | | | | 362/223 |
| 4,767,172 A | * | 8/1988 | Nichols | F21V 7/0091 |
| | | | | 355/1 |
| 5,173,810 A | * | 12/1992 | Yamakawa | F21V 5/04 |
| | | | | 250/216 |
| 5,757,557 A | * | 5/1998 | Medvedev | F21L 4/027 |
| | | | | 359/708 |
| 6,811,277 B2 | | 11/2004 | Amano | |
| 6,819,505 B1 | * | 11/2004 | Cassarly | F21L 4/027 |
| | | | | 359/708 |
| 7,401,948 B2 | * | 7/2008 | Chinniah | F21V 5/04 |
| | | | | 362/326 |
| 7,473,013 B2 | * | 1/2009 | Shimada | F21V 5/04 |
| | | | | 257/98 |

(Continued)

FOREIGN PATENT DOCUMENTS

| WO | 2018020218 A1 | 2/2018 |
| WO | 2018166911 A1 | 9/2018 |

*Primary Examiner* — Ismael Negron
(74) *Attorney, Agent, or Firm* — Brooks Kushman P.C.

(57) ABSTRACT

A light assembly includes a light source and a lens with a light-incident face defined by a central primary collector surface and secondary input surfaces extending transversely from the central primary collector surface, a light-emitting face opposite the light-incident face and defined by a central collimator profile and a pair of lateral side projections extending transversely from the central collimator profile, and a pair of secondary collecting surfaces extending between the light-incident face and the light-emitting face. Light from the light source received by the lens and exits as a generally collimated output.

20 Claims, 2 Drawing Sheets

(56) References Cited

U.S. PATENT DOCUMENTS

| | | | |
|---|---|---|---|
| 7,580,192 B1 | 8/2009 | Chu et al. | |
| 7,837,349 B2 | 11/2010 | Chinniah et al. | |
| 7,901,108 B2 * | 3/2011 | Kabuki | G02B 6/0018 362/235 |
| 8,310,685 B2 | 11/2012 | Dimitrov-Kuhl et al. | |
| 8,419,226 B2 * | 4/2013 | Fu | F21V 5/04 362/296.01 |
| 8,714,770 B2 | 5/2014 | Kato et al. | |
| 2004/0264196 A1 * | 12/2004 | Shu | F21K 9/233 362/294 |
| 2019/0162389 A1 * | 5/2019 | Shah | F21V 7/0091 |

\* cited by examiner

US 10,957,829 B2

LIGHT ASSEMBLY HAVING COLLIMATING TIR LENS

TECHNICAL FIELD

The present application relates to a lens and light assembly.

BACKGROUND

In vehicle lamps, such as headlamps, there is often tradeoff between efficiency and size when design lighting functions. Packaging constraints in vehicles often limit the lens size; however, the lamp is still required to meet light output requirements.

SUMMARY

According to one embodiment, a light assembly is provided have a light source and a lens body. The lens body has a light-incident face positioned adjacent the light source, and a light-emitting face opposite the light-incident face. A central optical axis extends in a forward direction through the light-incident face and the light-emitting face. The light-incident face is defined by a collimator profile revolved about a transverse axis perpendicular to the central optical axis forming a revolved collimator profile surface receiving light emitted. The light-incident face receives light from the light source. The light-emitting face is defined by a central collimating surface protruding from upper and lower secondary output surfaces. The light-emitting face receives light internal to the lens body and refracts a light output pattern being generally collimated in the forward direction. A pair of secondary collecting surfaces extend between the light-incident face and the light-emitting face. The secondary collecting surfaces are oriented to reflect light internal to the lens body in the forward direction.

In another embodiment, the revolved collimator profile surface has a central collimator contour and lateral side projections extending transversely from the central collimator contour.

In another embodiment, a primary collecting surface is defined by the central collimator contour and collimates at least a portion of the emitted light.

In another embodiment, secondary input surfaces are defined by the lateral side projections, wherein light incident on the secondary input surfaces is refracted, then reflected into the lens body through total internal reflection.

In another embodiment, the collimator profile is revolved about the transverse axis and defines the light-incident face as a light-incident cavity.

In another embodiment, the primary collecting surface is positioned within the cavity.

In another embodiment, an opening to the cavity is symmetric about the transverse axis and an upright direction.

In another embodiment, the light source is configured to be positioned at an opening to the cavity.

In another embodiment, the collimator profile is revolved about the transverse axis a radial distance generally equal to a radial distribution of the light source.

In another embodiment, the light source has a light emitting diode (LED) having a hemispherical light pattern with the radial distribution being generally 180-degrees.

In another embodiment, the collimator profile is revolved about the transverse axis in the range of 120-degrees to 180-degrees.

In another embodiment, the central collimating surface of the light-emitting face is a curved protrusion having a curvature in an upright direction, wherein the curvature is generally constant in the in a transverse direction.

In another embodiment, the upper and lower secondary output surfaces extend from upper and lower edges of the curvature.

In another embodiment, the upper and lower secondary output surfaces are generally planar.

According to at least one embodiment, a lens is provided with a light-incident face and a light-emitting face opposite the light-incident face. The lens body has a central optical axis extending in a forward direction through the light-incident face and the light-emitting face. A pair of secondary collecting surfaces extend between the light-incident face and the light-emitting face. The secondary collecting surfaces are oriented to reflect light internal to the lens body in the forward direction. The light-incident face is defined by a collimator profile revolved about a transverse axis perpendicular to the central optical axis. A revolved collimator profile surface receives light emitted from the light source. The light-emitting face is defined by a central collimating surface protruding from upper and lower secondary output surfaces. The light-emitting face receives light internal to the lens body and refracts a light output pattern being generally collimated in the forward direction.

According to at least one embodiment, a lens is provided with a light-incident face and a light-emitting face opposite the light-incident face. The lens body has a central optical axis extending in a forward direction through the light-incident face and the light-emitting face. The light-incident-face has a primary collector surface defined by a collimator profile revolved about a transverse axis perpendicular to the central optical axis. A pair of secondary collecting surfaces extend between the light-incident face and the light-emitting face, the secondary collecting surfaces oriented to reflect light internal to the lens body in the forward direction through total internal reflection. The light-emitting face is defined by a central primary collimating output surface protruding from upper and lower secondary output surfaces.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
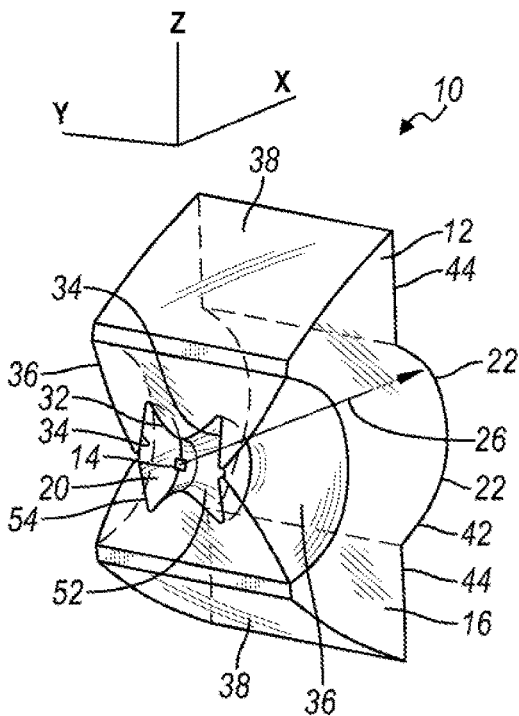
FIG. 1 is a rear perspective view of a lens according to one embodiment of the present application.

FIG. 1 illustrates a rear perspective view of a light assembly 10 having a lens 12 and at least one light source 14. The lens 12 has a lens body 16, which has a light-incident surface 20 for receiving light from the light source 14, and a light-emitting face 22 opposite the light-incident face 20. A central optical axis 26 extends in a forward direction X, through the light-incident face and the light-emitting face. The lens body 12 may be formed of optical transmissive material. For example, the lens body 12 may be made of a lightweight and robust plastic material such as polycarbonate or acrylic or any suitable material known in the art.

Figure 3:
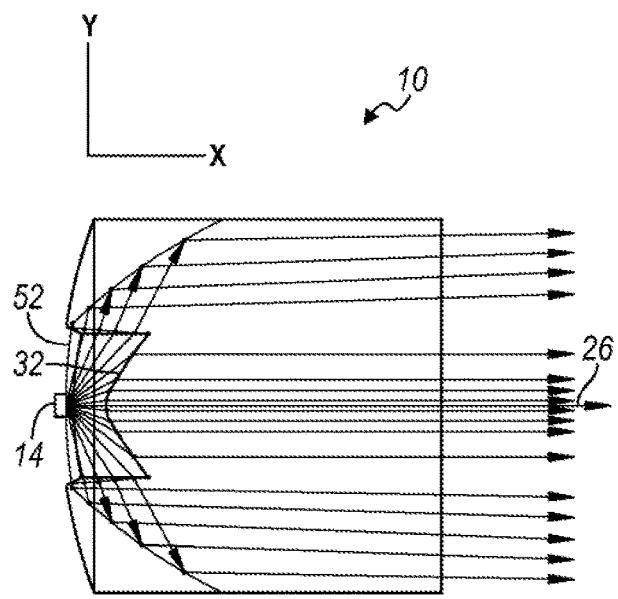
FIG. 3 is a top view of the lens of FIG. 1. A bottom view of the lens is symmetric to the top view.

The light-incident surface 20 is defined by a collimator profile 30. The collimator profile 30 is revolved about a transverse axis Y that is perpendicular to the central optical axis 26 to form the light-incident surface 20. The revolved collimator profile forms a central primary light-incident surface 32, secondary light-incident surfaces 34, and total internal reflection surfaces 36. The primary light-incident surface 32 is formed as a collimating surface configured to receive input light from the light source 14 and refract collimated light into the lens body. In the XY plane, the primary light-incident surface 32 receives the light distribution having a spread in the transverse direction Y and collimates light in the forward direction X, as shown in FIG. 3. The secondary light-incident surface 34 is formed as a refracting surface configured to receive input light from the light source 14. The total internal reflection surfaces 36 are configured to reflect light refracted by the secondary light-incident surface 34 in the X direction in the XY plane as shown in FIG. 3. The primary light-incident surface 32 and the secondary light-incident surfaces 34 may share a focal point.

The light-incident surface 20 is formed so that it directs light collected from the light source 14 into the lens body toward a pair of secondary collecting surfaces 38. The secondary collecting surfaces 38 form the upper and lower lens surfaces positioned on opposite sides of the lens body 16. The secondary collecting surfaces 38 define total internal reflection (TIR) surfaces that collect and reflect light internal to the lens body in the forward direction X.

Figure 5A:
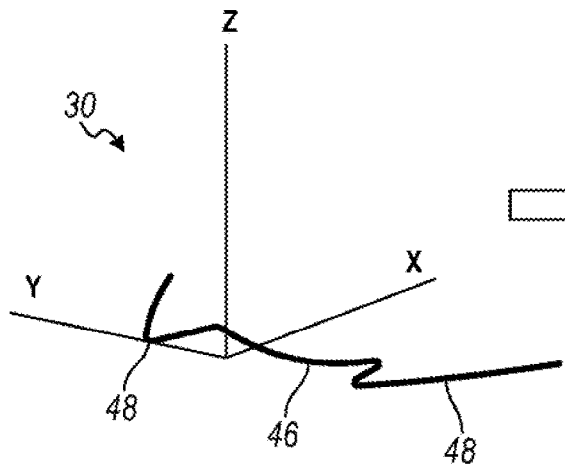
FIGS. 5A-5D are portions of the lens of FIG. 1 in exploded views to illustrate the construction of the lens.

As shown in FIG. 5A, the collimator profile 30 is defined in the XY plane. The collimator profile 30 has a central collimator contour 46 and lateral side projections 48 extending from transverse sides of the central collimator contour 46. The focal length and width of the profile may be adjusted to optimize light collection within the overall width constraints of the lens.

Figure 5B:
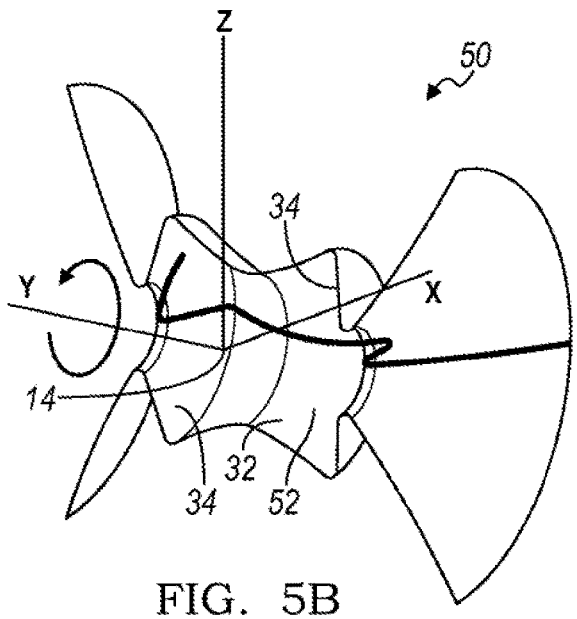

As illustrated in FIG. 5B, the collimator profile 30 is revolved about the transverse axis Y. The collimator profile 30 is revolved about the transverse axis Y a radial distance generally equal to a radial spread of the light source 14. In one embodiment, the collimator profile 30 is revolved about the transverse axis in the range of 120-degrees to 180-degrees. However, the collimator profile 30 may be revolved any suitable radial distance based on the light source or other design parameters. The light source 14 may be a semiconductor light emitting unit, such as a light emitting diode (LED) in which a rectangular light emitting chip emits a generally hemispherical light distribution. The LED may be oriented to have central optical axis directed along the optical axis 26. The light source 14 is not limited to a specific type of light source such as an LED, and any type of light source or semiconductor light source may be used such as a semiconductor device chip or a semiconductor light-emitting device which is sealed in a package or coated with a coating material etc.

As the collimator profile 30 is revolved, the revolved collimator surface 50 is formed, as shown in FIG. 5B. The revolved collimator surface 50 forms the primary light-incident surface 32, defined by the revolved collimator contour 46. Similarly, the revolved collimator surface 50 forms the secondary light-incident surfaces 34 and total internal reflection surface 36 defined by the lateral side projections 48. The revolved collimator surface 50 forms a light-incident cavity 52. The primary light-incident surface 32 and the secondary light-incident surface 34 are positioned within the cavity 52.

As shown in FIG. 1, the revolved profile defines an opening 54 to the cavity 52. The opening 54 is symmetric about the transverse direction Y and the upright direction Z. The opening 54 has a bow-tie shape and is defined by upper and lower collimator profiles positioned opposite each other. The collimator contour portions 46 are spaced apart and define the upper and lower opening portions. The lateral side projections 48 of the upper and lower collimator profiles 30 are positioned adjacent a transverse centerline of the opening. As shown in the Figures, the light source 14 is positioned at an opening 54 to the cavity 52. In another embodiment, the light source 14 may be positioned within the cavity 52, or the light source may be positioned outside the opening 54. The light source 14 may be located at the one focal point of the surfaces 32, 34. The light source 14 may be located along the optical axis 26 and along an axis of symmetry of the opening 54 or the cavity 52. It is possible for the LED to be placed at a position other than the optical axis 26 and other than the axis of symmetry of the opening 54 or the cavity 52, depending on the type of beam pattern needed.

Figure 4:
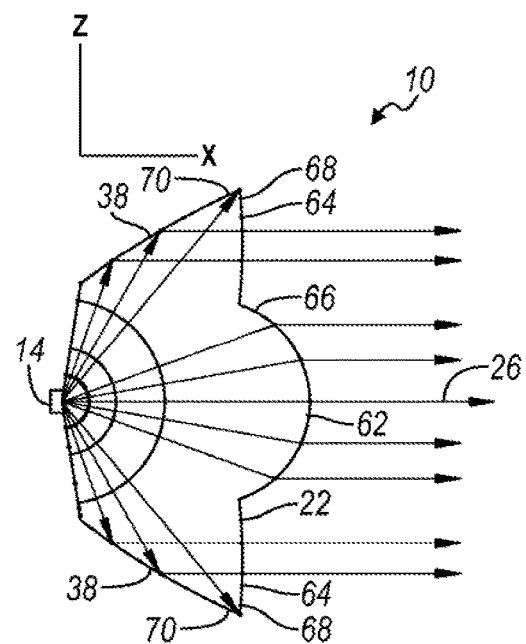
FIG. 4 is a side view of the lens of FIG. 1. The right-side view is symmetric to the left-side view.

The upper and lower secondary collecting surfaces 38 extend between the light-incident face 20 and the light-emitting face 22. The light-emitting face 22 receives light internal to the lens body and emits a light output pattern being generally collimated in the forward direction. As shown in FIG. 4, the light-emitting face 22 is defined by a central primary output surface 62 protruding forward from upper and lower secondary output surfaces 64.

Figure 2:
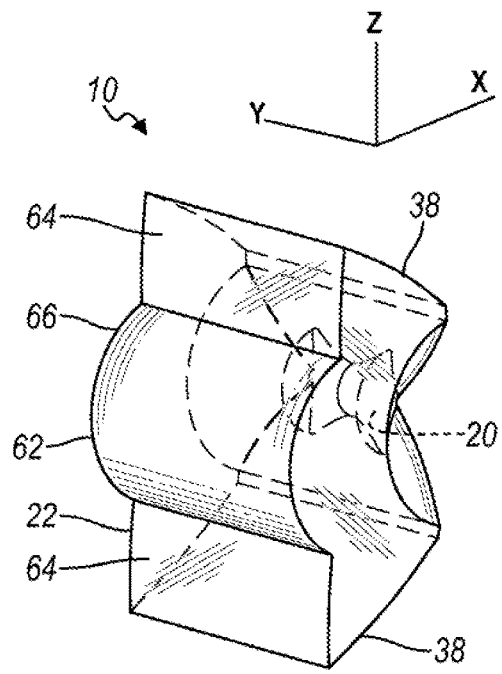
FIG. 2 is a front perspective view of the lens of FIG. 1.

The primary output surface 62 is a central collimating surface having a convex curvature 66 in the upright direction Z. As shown in FIG. 2, the curvature 66 of the protrusion is generally constant in the transverse direction Y. As such, the convex curvature 66 forms a partially cylindrical protrusion. The convex curvature 66 may be defined by a portion of a circle, or may be a free form curvature that collimates The secondary output surfaces 64 extend from upper and lower edges of the curvature 66. As shown in FIG. 4, the upper and lower secondary output surfaces 64 may be generally planar. In another embodiment, the upper and lower secondary output surfaces 64 may have a curvature along the upright direction Z to ensure output light is generally parallel to the optical axis 26. Outer edges 68 of the secondary output surfaces 64 are connected to forward edges 70 of the upper and lower collecting surfaces 38.

Figure 5D:
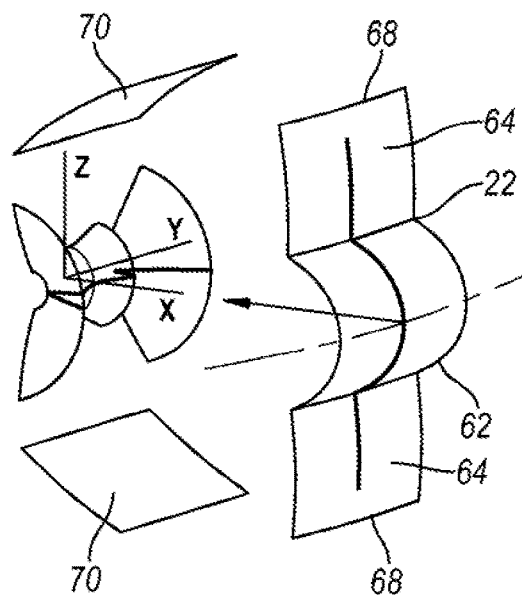
Figure 5C:
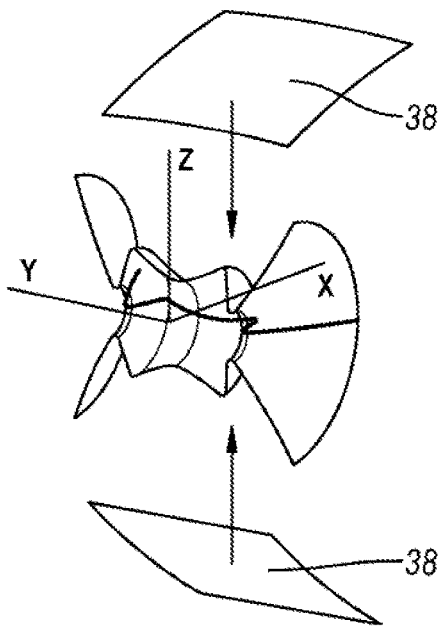

FIGS. 5A-5D illustrate the geometry and construction of the lens 12. The collimator profile 30 is defined in the XY plane, as shown in FIG. 5A. The collimator profile 30 is revolved about the transverse axis Y, as shown in FIG. 5B to define the revolved collimator surface 50. As shown in FIG. 5C, the upper and lower secondary collecting surfaces 38 are added to the revolved collimator surface 50. In FIG. 5D, the light-emitting face 22 is added.

The lens 12 provides high efficiency output for beam patterns such as high-beam patterns in vehicle headlamps. For example, the light assembly 10 with the lens 12 and a LED light source 14 may have over fifty-percent efficiency.

The light assembly 10 may be used in other automotive exterior lighting functions, or other lighting applications.

The lens 12 has a small aspect ratio which allows for ease of packaging in the width (Y-dimension) and height (Z dimension) directions. In one example, the lens 12 may have an aspect ratio with a width of 20 millimeters (mm) and a height of 50 mm. In another example, the lens 12 may have a width of 30 mm and height of 45 mm. Multiple lens elements 12 may be used to meet various photometry or output requirements. Multiple lens elements can be used for low and high beams as well as to for the same beam pattern.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A light assembly comprising:
    a light source; and
    a lens body comprising:
        a light-incident face positioned adjacent the light source for receiving light emitted from the light source, and the light-incident face defined by a collimator profile revolved about a transverse axis perpendicular to a central optical axis;
        a light-emitting face opposite the light-incident face such that the central optical axis extends in a forward direction through the light-incident face and the light-emitting face, the light-emitting face having upper and lower secondary output surfaces and a central collimating surface protruding from and between the upper and lower secondary output surfaces, the light-emitting face receives light internal to the lens body and refracts a light output pattern being generally collimated in the forward direction; and
        a pair of secondary collecting surfaces extending between the light-incident face and the light-emitting face, the secondary collecting surfaces configured to reflect light internal to the lens body in the forward direction.

2. The light assembly of claim 1, wherein the collimator profile is revolved about the transverse axis in the range of 120-degrees to 180-degrees.

3. The light assembly of claim 1, wherein the central collimating surface of the light-emitting face is a curved protrusion having a curvature protruding in a direction away from the light source, wherein the curvature is generally constant in the in a transverse direction.

4. The light assembly of claim 1, wherein the upper and lower secondary output surfaces extend from upper and lower edges of the central collimating surface.

5. The light assembly of claim 1, wherein the upper and lower secondary output surfaces are generally planar.

6. The light assembly of claim 1, wherein the collimator profile is revolved about the transverse axis a radial distance generally equal to a radial distribution of the light source.

7. The light assembly of claim 6, wherein the light source comprises a light emitting diode (LED) having a hemispherical light pattern with the radial distribution being generally 180-degrees.

8. The light assembly of claim 1, wherein the light-incident face comprises a primary collecting surface and lateral side surfaces extending transversely from the primary collecting surface.

9. The light assembly of claim 8, wherein the primary collecting surface is configured to collimate at least a portion of light toward the light emitting face.

10. The light assembly of claim 8, wherein light incident on the lateral side surfaces is refracted, then reflected into the lens body through total internal reflection.

11. The light assembly of claim 1, wherein the light-incident face defines a cavity.

12. The light assembly of claim 11, wherein the primary collecting surface defines at least a portion of the cavity.

13. The light assembly of claim 11, wherein the cavity has an opening symmetric about the transverse axis and an upright direction.

14. The light assembly of claim 11, wherein the cavity has an opening, and the light source is configured to be positioned at the opening of the cavity.

15. A lens comprising:
    a lens body having a light-incident face and a light-emitting face opposite the light-incident face, the lens body having a central optical axis extending in a forward direction through the light-incident face and the light-emitting face; and
    a pair of secondary collecting surfaces extending between the light-incident face and the light-emitting face, the secondary collecting surfaces oriented to reflect light internal to the lens body in the forward direction,
    wherein the light-incident face is defined by a collimator profile revolved about a transverse axis perpendicular to the central optical axis configured for receiving light emitted from a light source, and
    wherein the light-emitting face is defined by a central collimating surface protruding from upper and lower secondary output surfaces, the light-emitting face receives light internal to the lens body and refracts a light output pattern being generally collimated in the forward direction.

16. The lens of claim 15, wherein the revolved collimator profile of the light-incident face comprises:
    a primary collecting surface to collimate at least a portion of light received from a light source; and
    secondary input surfaces are defined by the lateral side projections, wherein light incident on the secondary input surfaces is refracted and then reflected into the lens body through total internal reflection.

17. The lens of claim 15, wherein the light-emitting face comprises:
    a central collimator surface of the light-emitting face is a curved protrusion having a curvature in the forward direction, wherein the curved protrusion is generally constant in the transverse direction; and
    upper and lower secondary output surfaces extend from upper and lower edges of the curvature.

18. The lens of claim 15, wherein the collimator profile is revolved about the transverse axis.

19. The lens of claim 18, wherein the revolved collimator profile defines a cavity, the cavity being symmetric about a transverse direction and an upright direction.

20. A lens comprising:
    a lens body having a light-incident face configured to be positioned adjacent a light source, and having a primary collector surface defined by a collimator profile revolved about a transverse axis perpendicular to a central optical axis of the lens body;

a light-emitting face opposite the light-incident face such that the central optical axis extends through the light-incident face and the light-emitting face, the light-emitting face having upper and lower secondary output surfaces and a central primary collimating output surface protruding from the secondary output surfaces; and a pair of secondary collecting surfaces extending between the light-incident face and the light-emitting face, the secondary collecting surfaces configured to reflect light internal to the lens body in a forward direction through total internal reflection.

\* \* \* \* \*

UNITED STATES PATENT AND TRADEMARK OFFICE
CERTIFICATE OF CORRECTION

PATENT NO. : 10,957,829 B2
APPLICATION NO. : 16/416257
DATED : March 23, 2021
INVENTOR(S) : Ashwin Thombre et al.

It is certified that error appears in the above-identified patent and that said Letters Patent is hereby corrected as shown below:

In the Claims

Column 6, Lines 3-4, Claim 8:
After "extending transversely from the"
Delete "primary collecting surface"
Insert --"central collimator contour"--.

Column 6, Lines 33-34, Claim 15:
After "for receiving light emitted from a light source"
Delete ","
Insert --";"--.

Column 6, Lines 52-53, Claim 17:
After "having a curvature in"
Delete "the forward"
Insert --"an upright"--.

Column 6, Line 67, Claim 20:
After "central optical axis of the lens"
Delete "body".

Column 7, Lines 10-11, Claim 20:
After "reflect light internal to the lens"
Delete "body".

Column 7, Line 11, Claim 20:
After "to the lens body in"
Delete "a"
Insert --"the"--.

Signed and Sealed this
Twentieth Day of December, 2022

Katherine Kelly Vidal
*Director of the United States Patent and Trademark Office*